United States Patent
Emami

(10) Patent No.: US 9,641,285 B2
(45) Date of Patent: May 2, 2017

(54) ULTRA LOW POWER (ULP) DECODER AND DECODING PROCESSING

(71) Applicant: SAMSUNG ELECTRONICS CO., LTD., Suwon-si, Gyeonggi-do (KR)

(72) Inventor: Shahriar Emami, San Jose, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 185 days.

(21) Appl. No.: 14/586,617

(22) Filed: Dec. 30, 2014

(65) Prior Publication Data

US 2015/0256289 A1 Sep. 10, 2015

Related U.S. Application Data

(60) Provisional application No. 61/948,943, filed on Mar. 6, 2014.

(51) Int. Cl.
   *H03M 13/15* (2006.01)
   *H04L 1/00* (2006.01)
   (Continued)

(52) U.S. Cl.
   CPC ........ *H04L 1/0041* (2013.01); *H03M 13/152* (2013.01); *H03M 13/1545* (2013.01);
   (Continued)

(58) Field of Classification Search
   CPC ............... H03M 13/15; H03M 13/152; H03M 13/1525; H03M 13/153; H03M 13/1535;
   (Continued)

(56) References Cited

U.S. PATENT DOCUMENTS 3,983,536 A 9/1976 Telfer
5,596,330 A 1/1997 Yokev et al.
(Continued)

OTHER PUBLICATIONS

Extended European Search Report dated Jul. 24, 2015 for European Application No. 15157930.7 from European Patent Office, pp. 1-12, Munich, Germany.
(Continued)

*Primary Examiner* — Albert Decady
*Assistant Examiner* — Christian Dorman
(74) *Attorney, Agent, or Firm* — Sherman IP LLP; Kenneth L. Sherman; Steven Laut

(57) ABSTRACT

A method includes decoding, by a receiver device, a spread spectrum coded stream of information including a multiple codeword blocks. The decoding includes determining a number of invalid codewords in a particular block of codewords. Based on a first particular number of invalid codewords in the particular block of codewords, the particular block of codewords is demapped, and parity codewords of the particular block of codewords are discarded. Based on a second particular number of invalid codewords in the particular block of codewords, a subset of syndrome components is computed using one or more coding enumerations with an update procedure for the subset of syndrome components, if all of the subset components are zero an erroneous bit is found, otherwise coding enumerations continue, the particular block of codewords is demapped, and parity codewords of the particular block of codewords are discarded.

29 Claims, 6 Drawing Sheets

(51) Int. Cl.
*H04B 1/69* (2011.01)
*H03M 13/37* (2006.01)

(52) U.S. Cl.
CPC ... *H03M 13/1575* (2013.01); *H03M 13/3707* (2013.01); *H03M 13/3715* (2013.01); *H04B 1/69* (2013.01); *H04L 1/0053* (2013.01); *H04L 1/0057* (2013.01); *H03M 13/15* (2013.01); *H03M 13/155* (2013.01)

(58) Field of Classification Search
CPC .......... H03M 13/1545; H03M 13/155; H03M 13/1575; H03M 13/37; H03M 13/3715; H04L 1/0041; H04L 1/0043; H04L 1/0044; H04L 1/0052; H04L 1/0053; H04B 1/69
See application file for complete search history.

(56) References Cited

U.S. PATENT DOCUMENTS

| | | | |
|---|---|---|---|
| 5,596,589 | A | 1/1997 | Thomsen et al. |
| 6,061,823 | A | 5/2000 | Nara |
| 6,175,588 | B1 | 1/2001 | Visotsky et al. |
| 6,301,681 | B1 | 10/2001 | Chen et al. |
| 6,634,007 | B1 | 10/2003 | Koetter et al. |
| 6,785,401 | B2 | 8/2004 | Walker et al. |
| 7,260,762 | B2 | 8/2007 | Desai et al. |
| 7,310,767 | B2 | 12/2007 | Desai et al. |
| 7,774,688 | B1* | 8/2010 | Teng ................. H03M 13/2909 714/782 |
| 8,050,361 | B2 | 11/2011 | Lundby et al. |
| 8,086,931 | B2 | 12/2011 | Litsyn et al. |
| 8,151,174 | B2 | 4/2012 | Betts |
| 8,332,731 | B1 | 12/2012 | Sforzin et al. |
| 8,375,272 | B2 | 2/2013 | Litsyn et al. |
| 8,631,307 | B2 | 1/2014 | Carginini et al. |
| 2006/0223460 | A1* | 10/2006 | Himayat ............... H04B 7/0669 455/101 |
| 2008/0046799 | A1 | 2/2008 | Geller et al. |
| 2010/0017684 | A1 | 1/2010 | Yang |
| 2011/0239094 | A1* | 9/2011 | Kwok ..................... G06F 7/724 714/782 |
| 2012/0254702 | A1* | 10/2012 | Koganei ............... H04L 1/0046 714/781 |

OTHER PUBLICATIONS

Kim, J.G. et al., "Adaptive Decoding Scheme for Concatenated Codes in Frequency-Hopped Spread-Spectrum Communications with a Pulse-Burst Jamming", Proceedings of the IEICE Transactions on Communications, Communications Society, Apr. 4, 1996, pp. 578-586, vol. E79B, No. 4, Tokyo, Japan.

Vajda, I., "Side Information Gained from Signal Matrices in FFH Spread Spectrum Systems", AEU Archiv fur Elektronik und Ubertragungstechnik, Mar. 1991, pp. 70-76, vol. 45, No. 2, Stuttgart, Germany.

Fiebig, U., On the Potential of FFH/MFSK CDMA for Mobile Radio Systems, Proceedings of the 5th IEEE International Symposium on Spread Spectrum Techniques and Applications, Sep. 2-4, 1998, pp. 332-337, vol. 1, IEEE, United States.

Wu, Y., "Low Power Decoding of BCH Codes", Proceedings of the 2004 International Symposium on Circuits and Systems (ISCAS'04), May 23-26, 2004, pp. 1-4, IEEE, United States.

Bynam, K. et al., "Samsung physical layer proposal", IEEE P802.15 Working Group for Wireless Personal Area Networks (WPANs), Oct. 31, 2013, pp. 1-25, IEEE, United States.

Bayes, T., "Spread Spectrum system analysis, development, and testing, in a multipath UHF radio environment", Department of Electrical and Electronic Engineering, Jan. 1989, pp. 1-23, University of Leeds, England [uploaded as Part 1 of 9].

Thakur, G., "Spread Spectrum Codes for Continuous-Phase Modulated Systems", Jan. 1, 2014, pp. 1-10, arXiv, Cornell University Library, United States.

Massachusetts Institute Technology, "Linear Block Codes: Encoding and Syndrome Decoding", Sep. 23, 2012, pp. 65-80, MIT 6.02, United States.

Lin, S. et al., "Error Control Coding: Fundamentals and Applications", Prentice-Hall Series in Computer Applications in Electrical Engineering, 1983, pp. 1-624, Prentice-Hall, United States.

Bayes, T., "Spread Spectrum system analysis, development, and testing, in a multipath UHF radio environment", Department of Electrical and Electronic Engineering, Jan. 1989, pp. 24-71, University of Leeds, England [uploaded as Part 2 of 9].

Bayes, T., "Spread Spectrum system analysis, development, and testing, in a multipath UHF radio environment", Department of Electrical and Electronic Engineering, Jan. 1989, pp. 72-107, University of Leeds, England [uploaded as Part 3 of 9].

Bayes, T., "Spread Spectrum system analysis, development, and testing, in a multipath UHF radio environment", Department of Electrical and Electronic Engineering, Jan. 1989, pp. 108-134, University of Leeds, England [uploaded as Part 4 of 9].

Bayes, T., "Spread Spectrum system analysis, development, and testing, in a multipath UHF radio environment", Department of Electrical and Electronic Engineering, Jan. 1989, pp. 135-164, University of Leeds, England [uploaded as Part 5 of 9].

Bayes, T., "Spread Spectrum system analysis, development, and testing, in a multipath UHF radio environment", Department of Electrical and Electronic Engineering, Jan. 1989, pp. 165-201, University of Leeds, England [uploaded as Part 6 of 9].

Bayes, T., "Spread Spectrum system analysis, development, and testing, in a multipath UHF radio environment", Department of Electrical and Electronic Engineering, Jan. 1989, pp. 202-224, University of Leeds, England [uploaded as Part 7 of 9].

Bayes, T., "Spread Spectrum system analysis, development, and testing, in a multipath UHF radio environment", Department of Electrical and Electronic Engineering, Jan. 1989, pp. 225-243, University of Leeds, England [uploaded as Part 8 of 9].

Bayes, T., "Spread Spectrum system analysis, development, and testing, in a multipath UHF radio environment", Department of Electrical and Electronic Engineering, Jan. 1989, pp. 244-262, University of Leeds, England [uploaded as Part 9 of 9].

* cited by examiner

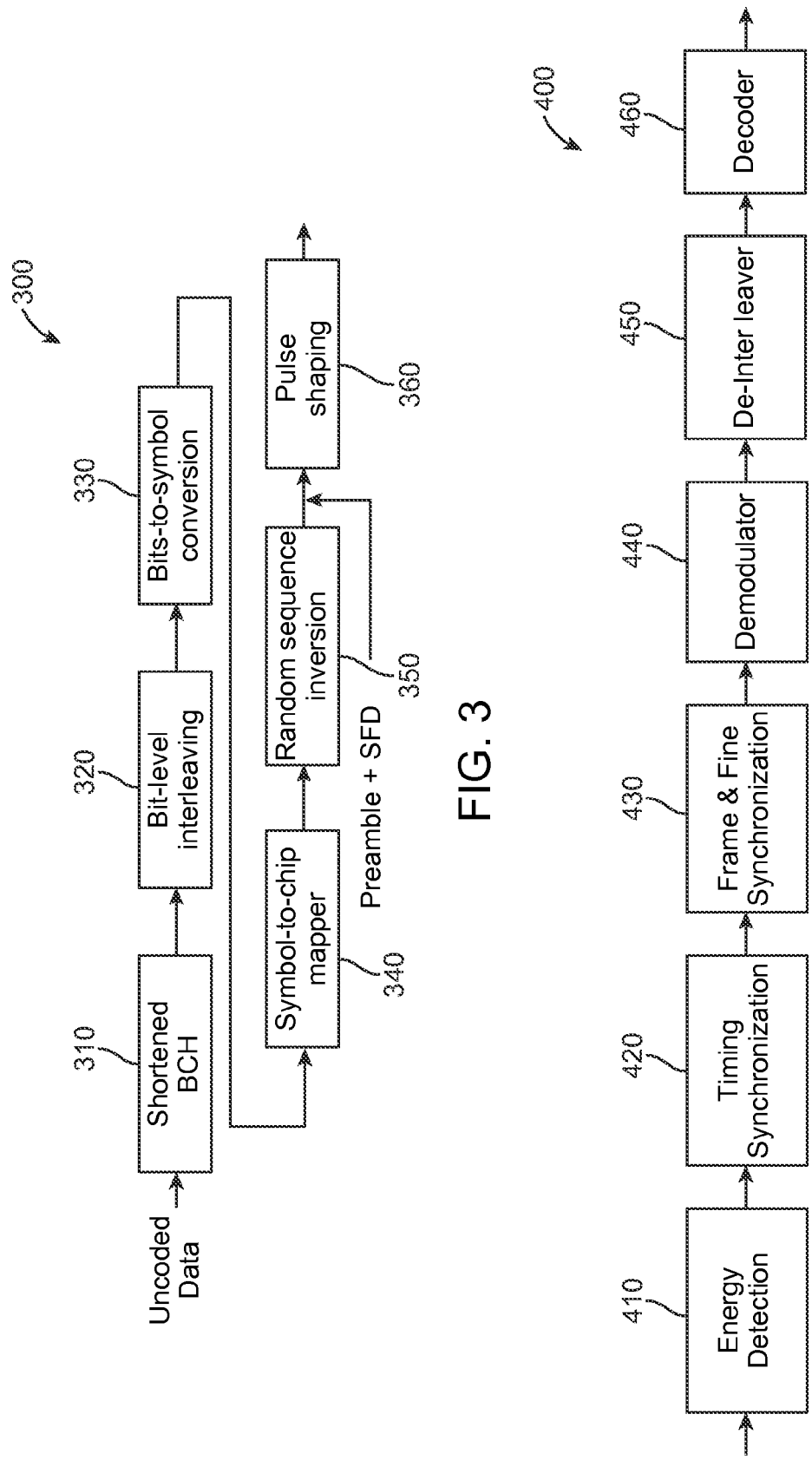

ULTRA LOW POWER (ULP) DECODER AND DECODING PROCESSING

CROSS-REFERENCE TO RELATED APPLICATIONS

This application claims the priority benefit of U.S. Provisional Patent Application Ser. No. 61/948,943, filed Mar. 6, 2014, incorporated herein by reference in its entirety.

TECHNICAL FIELD

One or more embodiments generally relate to efficient information decoding, in particular, to providing ultra-low power (ULP) forward error correction (FEC) decoding for variable spreading factor (VSF) ternary on-off keying (TOOK).

BACKGROUND

Wireless sensor networks (WSN) standards have been around for over a decade. The standard based designs typically experience a shorter than desired battery lifetime and large physical form factors. Conventional BCH decoding is complex and cannot be efficiently used in WSN applications.

SUMMARY

One or more embodiments generally relate to providing ultra-low power (ULP) forward error correction (FEC) decoding for variable spreading factor (VSF) ternary on-off keying (TOOK). In one embodiment, a method includes decoding, by a receiver device, a spread spectrum coded stream of information including a multiple codeword blocks. The decoding includes determining a number of invalid codewords in a particular block of codewords. Based on a first particular number of invalid codewords in the particular block of codewords, the particular block of codewords is demapped, and parity codewords of the particular block of codewords are discarded. Based on a second particular number of invalid codewords in the particular block of codewords, a subset of syndrome components is computed using one or more coding enumerations with an update procedure for the subset of syndrome components, if all of the subset of syndrome components are zero an erroneous bit is found, otherwise coding enumerations continue, the particular block of codewords is demapped, and parity codewords of the particular block of codewords are discarded.

In one embodiment, a wireless node is provided that includes a receiver including a decoder. The decoder is configured to: determine a number of invalid codewords in a particular block of codewords. For a first particular number of invalid codewords in the particular block of codewords, the decoder demaps the particular block of codewords and discards parity codewords of the particular block of codewords. For a second particular number of invalid codewords in the particular block of codewords, the decoder computes a subset of syndrome components using one or more coding enumerations with an update procedure for the subset of syndrome components, if all of the subset of syndrome components are zero an erroneous bit is found, otherwise coding enumerations continue, demaps the particular block of codewords, and discards parity codewords of the particular block of codewords.

In one embodiment, a non-transitory computer-readable medium having instructions which when executed on a computer perform a method comprising: decoding, by a processor device, a spread spectrum coded stream of information including a plurality of codeword blocks. The decoding comprises: determining a number of invalid codewords in a particular block of codewords; based on a first particular number of invalid codewords in the particular block of codewords, demapping the particular block of codewords and discarding parity codewords of the particular block of codewords; and based on a second particular number of invalid codewords in the particular block of codewords, computing a subset of syndrome components using one or more coding enumerations with an update procedure for the subset of syndrome components, if all of the subset of syndrome components are zero an erroneous bit is found, otherwise coding enumerations continue, demapping the particular block of codewords, and discarding parity codewords of the particular block of codewords.

In one embodiment, a receiver is provided including a decoder processor. The decoder processor is configured to: determine a number of invalid codewords in a particular block of codewords. For a first particular number of invalid codewords in the particular block of codewords, the decoder processor demaps the particular block of codewords and discards parity codewords of the particular block of codewords. For a second particular number of invalid codewords in the particular block of codewords, the decoder processor computes a subset of syndrome components using one or more coding enumerations with an update procedure for the subset of syndrome components, if all of the subset of syndrome components are zero an erroneous bit is found, otherwise coding enumerations continue, demaps the particular block of codewords, and discards parity codewords of the particular block of codewords.

These and other aspects and advantages of one or more embodiments will become apparent from the following detailed description, which, when taken in conjunction with the drawings, illustrate by way of example the principles of the one or more embodiments.

BRIEF DESCRIPTION OF THE DRAWINGS

For a fuller understanding of the nature and advantages of the embodiments, as well as a preferred mode of use, reference should be made to the following detailed description read in conjunction with the accompanying drawings, in which:

FIG. 3 shows a block diagram of a transmitter.

FIG. 4 shows a block diagram of a receiver including a decoder, according to an embodiment.

DETAILED DESCRIPTION

Figure 1:
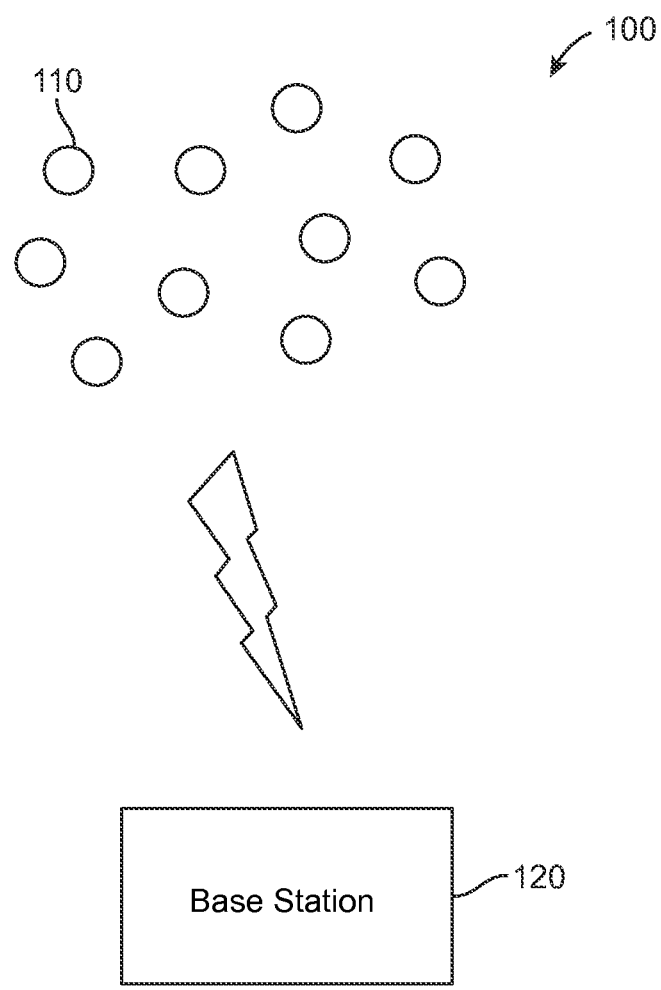
FIG. 1 shows an example layout of a wireless sensor network (WSN).

The following description is made for the purpose of illustrating the general principles of one or more embodiments and is not meant to limit the inventive concepts claimed herein. Further, particular features described herein can be used in combination with other described features in each of the various possible combinations and permutations. Unless otherwise specifically defined herein, all terms are to be given their broadest possible interpretation including meanings implied from the specification as well as meanings understood by those skilled in the art and/or as defined in dictionaries, treatises, etc.

Embodiments relate to providing power saving for providing ultra-low power (ULP) forward error correction (FEC) decoding for variable spreading factor (VSF) ternary on-off keying (TOOK). One or more embodiments may be implemented in a decoder of, for example, a receiver for a low powered device (e.g., a node in a wireless sensor network (WSN)). In one embodiment, a method includes decoding, by a receiver device, a spread spectrum coded stream of information including a multiple codeword blocks. The decoding includes determining a number of invalid codewords in a particular block of codewords. Based on a first particular number of invalid codewords in the particular block of codewords, the particular block of codewords is demapped, and parity codewords of the particular block of codewords are discarded. Based on a second particular number of invalid codewords in the particular block of codewords, a subset of syndrome components is computed using one or more coding enumerations with an update procedure for the subset of syndrome components, if all of the subset of syndrome components are zero the erroneous bit is found, otherwise enumerations continues, the particular block of codewords is demapped, and parity codewords of the particular block of codewords are discarded.

In ULP devices that rely on batteries for power, energy use cannot be taken for granted. A major part of the receiver complexity is due to the decoder (e.g., FEC decoder). In one embodiment, a decoder for error correcting codes is implemented for VSF-TOOK. In one example, the error correcting codes comprise BCH codes, which is a class of cyclic error-correcting codes that are constructed using finite fields. BCH codes were invented in 1959 by French mathematician Alexis Hocquenghem, and independently in 1960 by Raj Bose and D. K. Ray-Chaudhuri. The acronym BCH comprises the initials of these inventors' names. In one or more embodiments, the decoder processing is simpler as compared to a full-fledged BCH decoder. Based on the reduced decoder processing required, power consumption is reduced.

For a conventional BCH decoder: a syndrome vector that consists of 2t components is computed, where t is the error correction capability of the code; the error locator polynomial is determined (an algorithm can be used to determine the error locator polynomial coefficients, e.g., Berlekamp-Massey algorithm (finds the shortest linear feedback shift register (LFSR) for a given binary output sequence) or Peterson's algorithm (a concurrent programming algorithm for mutual exclusion that allows two processes to share a single-use resource without conflict, using only shared memory for communication); and the error location polynomial is solved (the roots of the error locator polynomial are then found through a Chien search). A fast algorithm for determining roots of polynomials defined over a finite field, typically used for finding the roots of error-locator polynomials encountered in decoding Reed-Solomon codes and BCH codes).

It has been shown that in presence of channel errors, syndrome computation, a Chien search procedure and Berlekamp-Massey procedure consume 34%, 61% and 4% of the consumed power, respectively. One or more embodiments eliminate the Berlekamp-Massey and Chien search procedures, and only the first component of the syndrome vector (25%) needs to be computed. In one example embodiment, roughly 10% of the full fledge decoding power is required, which reduces the power used for decoding by a wireless device (e.g., a WSN node device) by an order of magnitude.

FIG. 1 shows an example layout of a WSN 100, for implementation of an embodiment. In one example, the WSN 100 includes multiple nodes 110 and a base station 120. The base station 120 may comprise a mobile device (e.g., smart phone, camera, content player, video recorder, tablet, wearable device, etc.), a personal computer, a server device, cloud based server, a smart device (e.g., smart TV, etc.), etc.

In one example, the nodes 110 may provide spatially distributed autonomous sensors for monitoring conditions (e.g., physical, environmental conditions, such as temperature, sound, pressure, etc. and to cooperatively pass their data through the network to the base station 120. In another example, the nodes 110 are bi-directional, and may control sensor activity. In one example, the nodes 110 may number anywhere from a few to several hundred, or even thousands, where each node is connected to one or more sensors (e.g., sensor 240, FIG. 2). Some further examples of use cases for WSN 100 may include: forest fire detection, flood detection, air and water pollution, bio-complexity mapping, precision agriculture, telemonitoring of physiological data, tracking and monitoring patients, doctors, etc. in a hospital, drug administration, smart environments, home and office automation, vehicle applications (e.g., remote monitoring, remote inspection, vehicle tracking, etc.), inventory control, acoustic monitoring, motion detection, etc.

The size and cost constraints on nodes 110 result in corresponding constraints on resources, such as energy, memory, computational speed and communications bandwidth. The topology of the WSN 100 may vary from a star network to a multi-hop wireless mesh network.

Figure 2:
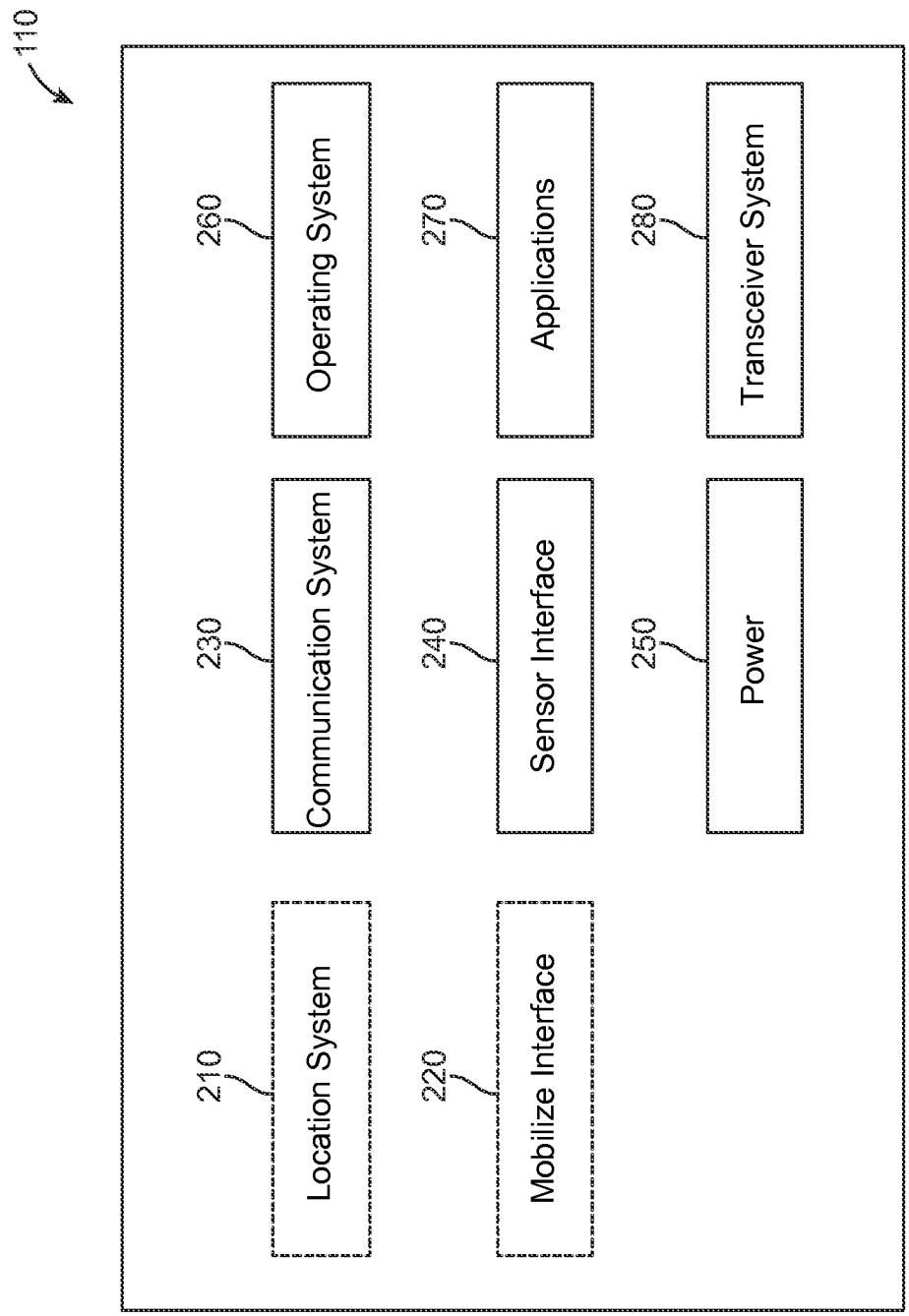
FIG. 2 shows a block diagram of architecture for a node in a WSN, according to an embodiment.

FIG. 2 shows a block diagram of architecture for a node 110, according to an embodiment. In one example, the node 110 includes a location system 210, a mobilizer interface 220, a communication system 230, sensor interface 240, a power unit 250, an operating system 260, one or more applications 270 and a transceiver system 280 (that includes a receiver 400 (FIG. 4), and which may or may not include a transmitter).

The location system 210 is responsible for finding location of the node 110 and providing drivers for the location finding instruments if they are present on the node 110 (e.g., global positioning system (GPS) sensor/system, distance processing, etc.). The mobilizer interface 220 is responsible for a mobilizer driver, and controlling of a mobilizer (e.g., for moving the node 110). The mobilizer interface 220 may be optional and is included if the node 110 has a mobilizer in it.

The communication system 230 is responsible for the route set up, channel allocation, new node detection, route table maintenance, encryption/decryption of the data, providing other security features as required, providing good quality of service (QoS), error checking and correction, data buffering, data forwarding, etc. In one embodiment, communications system 230 circuitry may include any suitable communications circuitry operative to connect to a communications network (e.g., WSN 100, FIG. 1) and to transmit communications and data from the node 110 to other devices within the communications network (e.g., the base station 120). Communications circuitry may be operative to interface with the communications network using any suitable communications protocol such as, for example, Wi-Fi (e.g., an IEEE 802.11 protocol), BLUETOOTH®, ZIGBEE®, etc.

The operating system (OS) 260 may include hardware common microcode that is used by all other high-level node 110 resident interfaces and modules. The purpose of OS 260 is to shield the higher level interfaces and modules from machine level functionality of a microprocessor or processor. In one example, the OS 260 includes a tiny-OS, which is open source software designed particularly for WSNs. The sensor interface 240 is responsible to provide drivers to sensors present in the node 110, to collect data from a sensor when generated, to switch one or more sensors on and off, configure the sensors, and any other function that is related to sensors. The sensors connected to the sensor interface 240 may be included on the node 110 or external to the node 110. In one embodiment, the node 110 may include one or more sensors or connect to one or more sensors. The sensors may include accelerometer, gyroscope, microphone, temperature, light, barometer, magnetometer, compass, radio frequency (RF) identification sensor, etc.

Sensors are hardware devices that produce a measurable response to a change in a physical condition, such as temperature or pressure. Sensors may measure physical data of the parameter to be monitored. The continual analog signal produced by the sensors is digitized by an analog-to-digital converter and sent to controllers for further processing. Sensors may be grouped into categories, such as passive, omni-directional sensors, narrow-beam sensors, and active sensors. Passive sensors sense the data without actually manipulating the environment by active probing. Passive sensors are self-powered, that is, energy is needed only to amplify their analog signal. Active sensors actively probe the environment and require continuous energy from a power source. Narrow-beam sensors have a defined notion of direction of measurement, similar to a camera. Omni-directional sensors have no notion of direction involved in their measurements. Each node 110 has a particular area of coverage for which it may reliably and accurately report the particular quantity of data that it is sensing. Several sources of power consumption in sensors are: signal sampling and conversion of physical signals to electrical ones, signal conditioning, and analog-to-digital conversion.

In one example, the node 110 includes memory that may include, for example, cache, Flash memory, ROM, and/or RAM/DRAM. In some embodiments, memory may be specifically dedicated to storing firmware (e.g., for device applications such as an operating system, user interface functions, and processor functions). Memory may be operative to store information related to other devices with which the node 110 performs communications operations (e.g., saving contact information related to communications operations or storing information related to different media types and media items selected by the user).

The applications interface 270 is responsible for data aggregation, in node processing and any other application specific functions. The power unit 250 includes a source of power for the node 110. The source of power may include battery power, capacitors, a charging unit (e.g., solar, energizing solutions, etc.). The node 110 consumes power for sensing, communicating and data processing. Batteries, both rechargeable and non-rechargeable, are the main source of the power source for the node 110. Batteries are classified according to electrochemical material used for the electrodes, such as NiCd (nickel-cadmium), NiZn (nickel-zinc), NiMH (nickel-metal hydride), and lithium-ion. Some sensors may be able to renew their energy from solar sources, temperature differences, or vibration. The power unit 250 may include power saving policies, such as Dynamic Power Management (DPM) and Dynamic Voltage Scaling (DVS). DPM conserves power by shutting down parts of the node 110 that are not currently used or active. A DVS scheme varies the power levels within the node 110 depending on the non-deterministic workload.

The transceiver system 280 is used for processing received information and sending information. The transceiver system includes the receiver 400 (FIG. 4) that receives coded information and decodes the received information, and for transmitting data obtained from the sensor (s).

FIG. 3 shows a block diagram of a transmitter 300. The transmitter 300 includes specialized processing hardware and interfaces, including: shortened BCH code processing 310, bit-level interleaving 320, bits-to-symbol conversion 330, symbol-to-chip mapper 340, random sequence inversion 350 and pulse shaping 360. The preamble and start frame delimiter (SFD) for an Ethernet frame are added between the random sequence inversion 350 and the pulse shaping 360.

While BCH coding is described, one or more embodiments may include other coding in place of the shortened BCH 310 coding for using optimized decoding by the decoder 460 (FIG. 4). BCH codes form a class of cyclic error-correcting codes that are constructed using finite fields. One of the features of BCH codes is that during code design, there is precise control over the number of symbol errors correctable by the code. It is possible to design binary BCH codes that can correct multiple bit errors. BCH codes may be decoded via syndrome decoding.

Pulse-position modulation (PPM) is a form of signal modulation in which M message bits are encoded by transmitting a single pulse in one of $2^M$ possible time-shifts. This is repeated every T seconds, such that the transmitted bit rate is M/T bits per second.

One or more embodiments use a physical layer (PHY), VSF-TOOK, where the bit stream is initially protected with a FEC BCH code. A single bit or a number of bits are mapped into spreading codewords or sequences. On-off keying (OOK) chip modulation with Gaussian pulse shaping is used by the transmitter 300.

In one example embodiment, the bit stream is encoded by the transmitter 300 using (63, 51) BCH code. The bits '0' and '1' are mapped into '10' and '01' codewords, respectively, as seen in Table 1 below.

TABLE 1

| Input | Output |
|-------|--------|
| 0     | 10     |
| 1     | 01     |

OOK modulation is employed to transmit information from the transmitter 300 to a receiver (e.g., receiver 400, FIG. 4). After the transmitter transmits encoded information, the bits are recovered and routed to the decoder 460 of the receiver 400 (FIG. 4).

FIG. 4 shows a block diagram of a receiver 400 including a decoder 460, according to an embodiment. Forward error correction is an extremely useful functionality, but its implementation requires some complexity. In one example embodiment, the decoder 460 decodes codes (e.g., BCH codes or other codes) for VSF-TOOK. The PHY receiver may further include interfaces and processing for energy detection 410, timing synchronization 420, frame and fine synchronization 430, demodulator 440, and de-interleaver 450 in addition to the decoder 460.

OOK denotes a simple form of amplitude-shift keying (ASK) modulation that represents digital data as the presence or absence of a carrier wave. The presence of a carrier for a specific duration represents a binary one, while its absence for the same duration represents a binary zero. Other schemes may vary these durations to convey additional information. In one example embodiment, the possible received codewords are '10', '01', '11' and '00'. In one example, received codewords '10' and '01' are considered valid. Received codewords '11' or '00' are considered as invalid, and signal occurrence of a channel error. In this example, the BCH coded data bits, encoded spread spectrum coded stream, received spread spectrum coded stream (w/o error) and received spread spectrum coded stream (w/error) are provided below:

| BCH coded bits | | | | |
|---|---|---|---|---|
| 0 | 1 | 1 | 0 | ... |
| Spread spectrum coded stream | | | | |
| 10 | 01 | 01 | 10 | ... |
| Received spread spectrum coded stream (w/o error) | | | | |
| 10 | 01 | 01 | 10 | ... |
| Received spread spectrum coded stream (with error) | | | | |
| 10 | 11 | 01 | 10 | ... |

In a conventional BCH decoder, the received chip stream is demapped into a bit stream, and the bit stream is decoded by a conventional BCH decoder in three steps. First, the syndrome vector consisting of 2t components is computed where t is the error correction capability of the code. Then, the error locator polynomial is determined. Finally, the error location polynomial is solved. Berlekamp-Massey or Peterson's algorithm can be used to determine the error locator polynomial coefficients. The Berlekamp-Massey algorithm is conventionally more popular as it is less complex. The roots of the error locator polynomial are then found through a search procedure, conventionally known as a Chien search. The full-fledged conventional decoding procedure comprised of syndrome vector determination, finding the error locator polynomial coefficients and solving the error locator polynomial equation is quite complex. Conventionally, syndrome computation and the Chien search procedure consume far more power as compared to a Berlekamp-Massey procedure.

One or more embodiments provide a way to lower the complexity of a conventional decoder. In one embodiment, the error location may be determined by the presence of invalid codewords, which reduces the computational complexity as compared to a conventional BCH decoder. In one example, the decoder 460 counts the number of invalid codewords within the systematic portion of the codeword (e.g., a BCH codeword). If a first particular there are no (i.e., zero (0)) invalid codewords, a conventional decoder (e.g., a conventional BCH decoder) is utilized to correct any errors undetected by this approach. If, however, the number of the invalid codewords are greater than a first particular number (e.g., two (2), which is beyond the error correction capability of a (63, 51, 2) code), then the decoder 460 processes the chip stream and demaps the chip stream into a bit stream, and the parity portion is discarded. If there is a second particular number for invalid codewords (e.g., either a single error or two errors within the block), instead of performing a Chien search, in one embodiment the decoder 460 processing is performed, and requires computing a subset of syndrome components computation. In other words, the complexity would be 2/2t of the conventional syndrome vector calculations.

In one example embodiment, it is established that roughly a single component syndrome computation is sufficient to correct errors when using (63, 51, 2) BCH code. It is known that in the absence of bit errors in a code block all 2t components of a syndrome vector are zero. It can be shown that single error or double error events do not lead to $S_1=S_3=0$, where S is a syndrome vector. As such, an $S_1=S_3=0$ condition may be used to detect an error-free event, if error-free, single error and double error event are the only possible events.

The parity check matrix of a BCH code of length n (where n is a positive integer), information size of k bits (where k is a positive integer) and error correction capability of t (where t is a positive integer) are errors denoted by (n,k,t) and is given by $$H = \begin{bmatrix} 1 & \cdots & \alpha^{n-1} \\ \vdots & \ddots & \vdots \\ 1 & \cdots & (\alpha^{2t})^{n-1} \end{bmatrix}$$

where $\alpha$ is the primitive element of a Galois field (GF) ($2^m$) and $m=\log_2(1+n)$ (where m is a positive integer). The codeword polynomial associated with each and every code word c is $$c = c_0 + c_1 x + c_2 x^2 + \ldots + c_{n-1} x^{n-1}$$

(where x is a positive integer). For each and every codeword, as per definition, $$H \cdot c^T = 0$$

(where H is a matrix). Upon substitution for both H and c, we end up with $$c_0 + c_1(\alpha^j) + c_2(\alpha^j)^2 + \ldots + c_{n-1}(\alpha^j)^{n-j} = 0, j=1,2,\ldots,2t.$$

The syndromes vector associated with a received code vector, consisting of 2t syndromes, is defined as:

$$[S_1 S_2 \ldots S_{2t}]^T = H r^T$$

where r is the received polynomial. In presence of v errors in location $u_1, u_2, \ldots, u_v$, syndromes may be written as $$S_j = \alpha^{u_1 j} + \alpha^{u_2 j} + \ldots + \alpha^{u_v j}.$$

For instance the first component of the syndrome vector are $$S_1 = \alpha^{u_1}$$

and $$S_1 = \alpha^{u_1} = \alpha^{u_2}$$

subject to single (t=1) and double errors (t=2), respectively. Subject to Gray coding (Gray code is a binary numeral system where two successive values differ in only one bit (binary digit)) enumeration, successive syndromes are related through:

$$S_{j,new} = S_j + \alpha^{u p j}$$

where p denotes the error position where two successive codes differ. As such, in one embodiment, instead of computing a brand new syndrome every time, the decoder 460 performs a single processing operation that is sufficient to update the syndrome component. An example for syndrome update procedure is provided below in Table 2.

TABLE 2

| (u1, u2) | $S_1$ |
|---|---|
| (0, 0) | Compute $S_1$ based on the definition |
| (1, 0) | $S_{1,2} = S_1 + \alpha^{u1}$ |
| (1, 1) | $S_{1,3} = S_{1,2} + \alpha^{u2}$ |
| (0, 1) | $S_{1,4} = S_{1,3} + \alpha^{u1}$ |

In one embodiment, the complexity associated with multiple error correction processing will be roughly equivalent to a single syndrome computation as long as $$2^v << n.$$

In one embodiment, the process for decoder 460 starts off with, for example, an all zero input bit combination. This bit combination is inserted in the received codeword, and the syndrome components $S_1$ and $S_3$ associated with the received codeword is determined. If $S_1$ and $S_3$ turn out to be zero, the correct bits are found. Otherwise, the successive Gray code combination is inserted in the received codeword and the $S_1$ and $S_3$ associated with this received code is determined. The updated rule for $S_1$ and $S_3$ is used instead of determining it from scratch. If $S_1$ and $S_3$ turn out to be zero, the correct bits are found. Otherwise, the decoder 460 processing continues until the correct bit combination is found.

Figure 5:
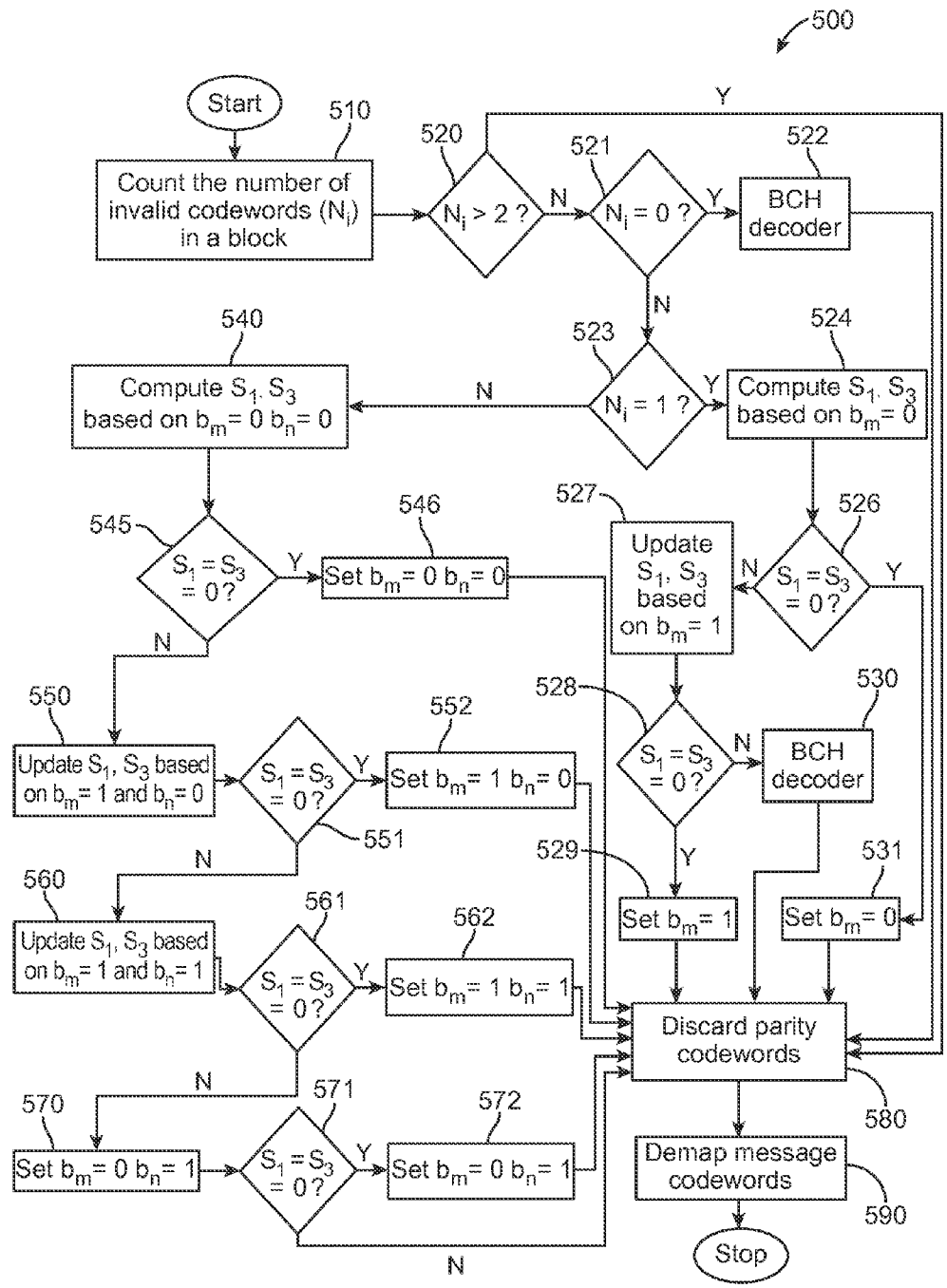
FIG. 5 shows a decoder process flow, according to an embodiment.

FIG. 5 shows a decoder 460 (FIG. 4) process 500 flow, according to an embodiment. In one embodiment, process 500 begins with block 510 where the number of invalid codewords ($N_i$) is counted within a codeword block. Process 500 proceeds to block 520 where it is determined whether the number of invalid codewords $N_i$ exceeds a first particular number (e.g., two (2)). If it is determined that the number of invalid codewords $N_i$ is greater than the first particular number (e.g., two (2)), process 500 continues to block 580 where the parity codewords are discarded. Process 500 continues to block 590 where message codewords are demapped and the decoding process 500 then ends.

If it is determined in block 520 that the number of invalid codewords $N_i$ is not greater than the first particular number (e.g., two (2)), process 500 proceeds to block 521 where it is determined whether the number of invalid codewords $N_i$ is equal to a third particular number (e.g., zero (0)). If it is determined in block 521 that the number of invalid codewords $N_i$ is equal to the third particular number (e.g., zero (0)), the process 500 proceeds to block 522 where a conventional decoder (e.g., a conventional BCH decoder) processes the block of codewords, and then process 500 proceeds to blocks 580, and then to block 590.

If it is determined in block 521 that the number of invalid codewords $N_i$ is not equal to the third particular number (e.g., zero (0)), process 500 proceeds to block 523. In block 523, it is determined whether the number of invalid codewords $N_i$ is equal to a second particular number (e.g., one (1)). If it is determined in block 523 that the number of invalid codewords $N_i$ is equal to the second particular number (e.g., one (1)), process 500 proceeds to block 524 where the syndromes $S_1$ and $S_3$ are computed based on $b_m=0$ (where b is a binary digit, and m is a positive integer). Process 500 continues to block 526 where it is determined whether $S_1$ and $S_3$ are equal to zero (0). If it is determined in block 526 that $S_1$ and $S_3$ are equal to zero (0), process 500 continues to block 531 where $b_m$ is set equal to zero (0), and process 500 continues to block 580 and then to block 590.

If it is determined in block 526 that $S_1$ and $S_3$ are not equal to zero (0), process 500 continues to block 527 where S1 is updated based on $b_m$ being equal to one (1). Process 500 continues to block 528 where it is determined whether $S_1$ and $S_3$ are equal to zero (0). If it is determined in block 528 that $S_1$ and $S_3$ are not equal to zero (0), then process 500 proceeds to block 530 where the conventional decoder (e.g., a conventional BCH decoder) is used to process the codeword block, and process 500 then continues to block 580 and then to block 590. If it is determined in block 528 that $S_1$ and $S_3$ are equal to zero (0), then process 500 proceeds to block 529 where $b_m$ is set equal to 1, and process 500 continues to block 580 and then to block 590.

If it is determined in block 523 that the number of invalid codewords $N_i$ is not equal to the second particular number (e.g., one (1)), process 500 proceeds to block 540 where $S_1$ is computed based on $b_m$ and $b_n$ (n being a positive integer) both being equal to zero (0). Process 500 continues to block 545 where it is determined whether $S_1$ and $S_3$ are equal to zero (0). If it is determined that $S_1$ and $S_3$ are equal to zero (0), process 500 continues to block 546 where $b_m$ and $b_n$ are both set equal to zero (0). Process 500 then continues to block 580 and then to block 590.

If it is determined in block 545 that $S_1$ and $S_3$ are not equal to zero (0), process 500 continues to block 550 where $S_1$ and $S_3$ are updated based on $b_m$ being equal to one (1) and $b_n$ being equal to zero (0)s. Process 500 continues to block 551 where it is determined whether $S_1$ and $S_3$ are equal to zero (0). If it is determined in block 551 that $S_1$ and $S_3$ are equal to zero (0), process 500 continues to block 552 where $b_m$ is set equal to one (1) and $b_n$ is set equal to zero (0). Process 500 then continues to block 580 and then to block 590.

If it is determined in block 551 that $S_1$ and $S_3$ are not equal to zero (0), process 500 continues to block 560 where $S_1$ and $S_3$ are updated based on $b_m$ being equal to one (1) and $b_n$ being equal to one (1). Process 500 proceeds to block 561 where it is determined whether $S_1$ and $S_3$ are equal to zero (0). If it is determined in block 561 that $S_1$ and $S_3$ are equal to zero (0), process 500 continues to block 562 where $b_m$ and $b_n$ are both is set equal to one (1). Process 500 then continues to block 580 and then to block 590.

If it is determined in block 561 that $S_1$ and $S_3$ are not equal to zero (0), process 500 continues to block 570 where $b_m$ and $b_n$ are both set to one (1). Process 500 proceeds to block 571 where it is determined whether $S_1$ and $S_3$ are equal to zero (0). If it is determined in block 571 that $S_1$ and $S_3$ are equal to zero (0), process 500 continues to block 572 where $b_m$ is set to zero (0) and $b_n$ is set equal to one (1). Process 500 then continues to block 580 and then to block 590.

In one embodiment, process 500 decodes a coded stream (e.g., a BCH coded stream) that is modulated using spread spectrum OOK. Only the first and third components of the syndrome vector ($S_1$ and $S_3$) need to be computed as opposed to conventional decoders that compute $S_2$ and $S_3$, which reduces power consumed during decoding processing.

In one embodiment, all chip level error scenarios are examined to ensure that all possible outcomes are considered. There is one particular scenario that requires careful consideration. Consider the scenario where there are two (2) errors in one spread spectrum codeword and a third one in another codeword. The two error event in one spread spectrum symbol will not be detected. As such the event will be classified as a single error case. The process 500 is configured such that this case is handled by the conventional decoder (e.g., a conventional BCH decoder), which is capable of correcting two errors.

Figure 6:
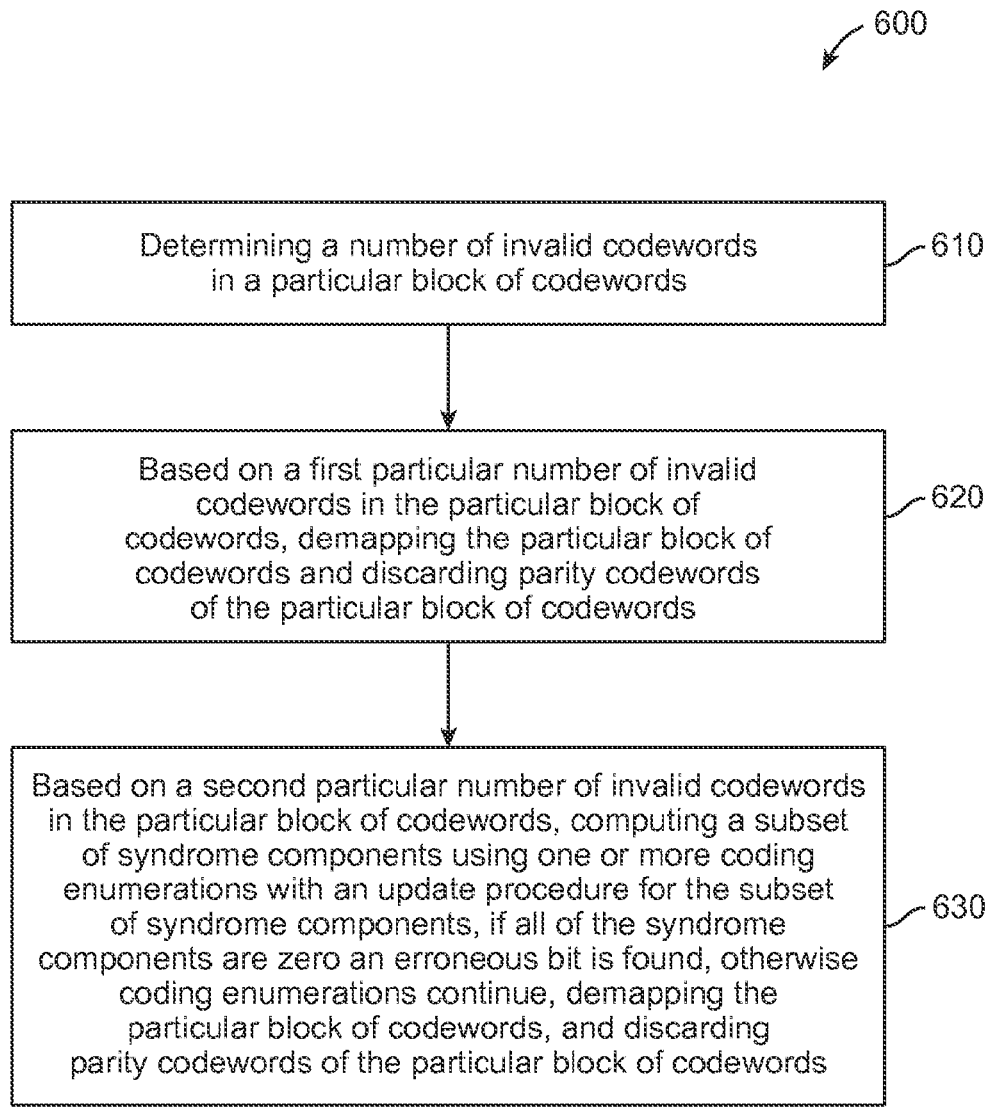
FIG. 6 shows a process for information decoding, according to one embodiment.

FIG. 6 shows a process 600 for information decoding, according to one embodiment. In one embodiment, process 600 proceeds by decoding, by a receiver device (e.g., receiver 400, FIG. 4), a spread spectrum coded stream of information including multiple codeword blocks. Block 610 includes determining a number of invalid codewords in a particular block of codewords. In block 620, based on a first particular number (e.g., two (2)) of invalid codewords in the particular block of codewords, process 600 demaps the particular block of codewords and discards parity codewords of the particular block of codewords. In block 630, based on a second particular number (e.g., one (1)) of invalid codewords in the particular block of codewords, process 600 computes a subset of syndrome components is computed using one or more coding enumerations with an update procedure for the subset of syndrome components, if all of the syndrome subset components are zero an erroneous bit is found, otherwise coding enumerations continue, the particular block of codewords is demapped, and parity codewords of the particular block of codewords are discarded.

In one embodiment, process 600 may include processing based on a third particular number (e.g., zero (0)) of invalid codewords, and uses a BCH decoder to correct errors, demaps the particular block of codewords, and discards parity codewords of the particular block of codewords. In process 600, demapping may include demapping the particular block of codewords into a bit stream. Process 600 may include processing the update procedure for the subset of syndrome components based on updating the subset of syndrome components successively as needed using a single operation.

In one embodiment, in process 600 the update procedure for the subset of syndrome components may include updating the subset of syndrome components by successively updating a same syndrome equation with multiple input combinations. The component syndrome may include a vector including a it component, where t is a coding error correction capability. In process 600, the receiver device may comprise a wireless node that belongs to a WSN. In one embodiment, process 600 may further include receiving the spread spectrum coded stream of information from a transmitter device (e.g., transmitter 300, FIG. 3).

Figure 7:
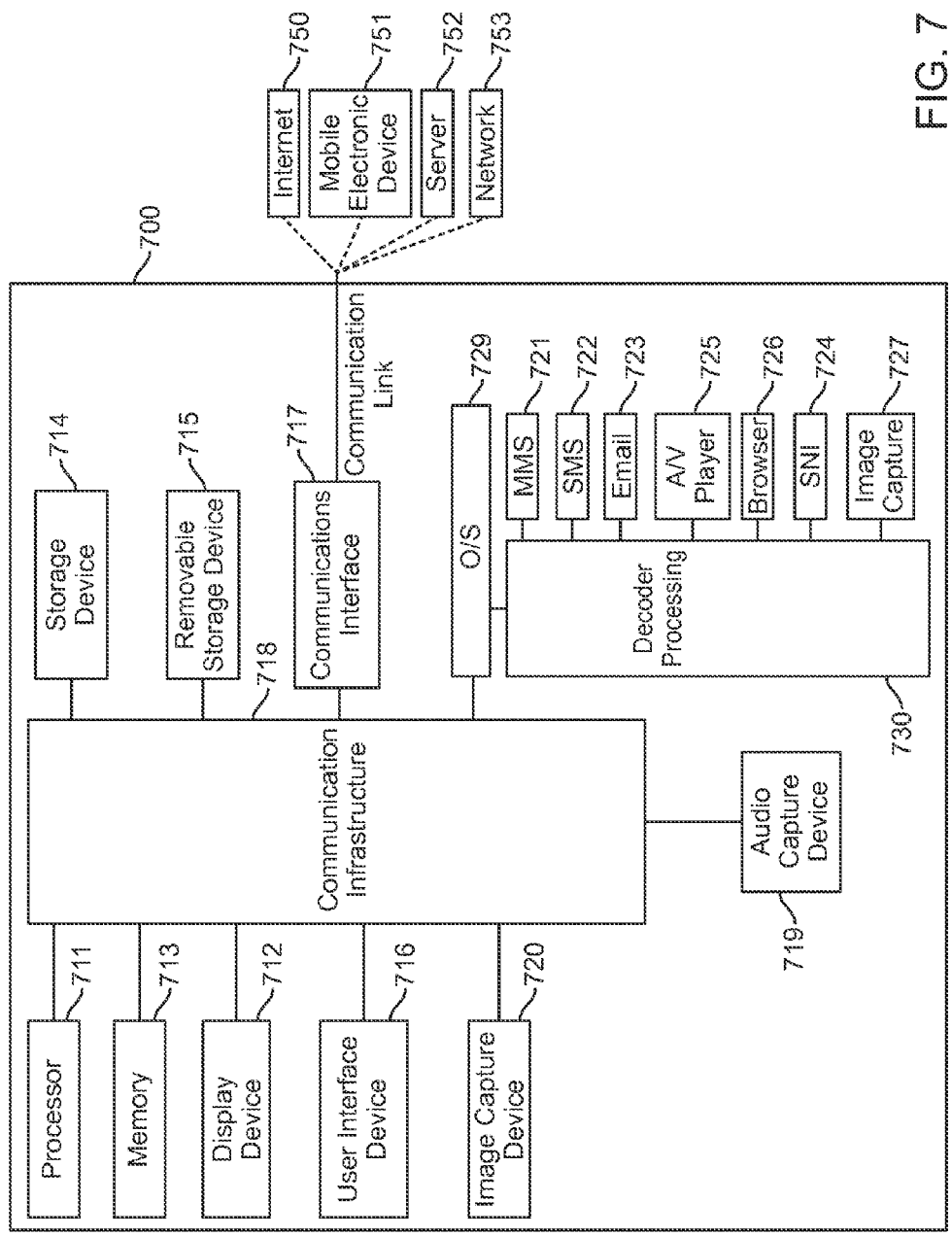
FIG. 7 is a high-level block diagram showing an information processing system comprising a computing system implementing one or more embodiments.

FIG. 7 is a high-level block diagram showing an information processing system comprising a computing system 700 implementing one or more embodiments. The system 700 includes one or more processors 711 (e.g., ASIC, CPU, etc.), and may further include an electronic display device 712 (for displaying graphics, text, and other data), a main memory 713 (e.g., random access memory (RAM), cache devices, etc.), storage device 714 (e.g., hard disk drive), removable storage device 715 (e.g., removable storage drive, removable memory, a magnetic tape drive, optical disk drive, computer-readable medium having stored therein computer software and/or data), user interface device 716 (e.g., keyboard, touch screen, keypad, pointing device), and a communication interface 717 (e.g., modem, wireless transceiver (such as Wi-Fi, Cellular), a network interface (such as an Ethernet card), a communications port, or a PCMCIA slot and card).

The communication interface 717 allows software and data to be transferred between the computer system and external devices through the Internet 750, mobile electronic device 751, a server 752, a network 753, etc. The system 700 further includes a communications infrastructure 718 (e.g., a communications bus, cross bar, or network) to which the aforementioned devices/interfaces 711 through 717 are connected.

The information transferred via communications interface 717 may be in the form of signals such as electronic, electromagnetic, optical, or other signals capable of being received by communications interface 717, via a communication link that carries signals and may be implemented using wire or cable, fiber optics, a phone line, a cellular phone link, an radio frequency (RF) link, and/or other communication channels.

In one implementation of one or more embodiments in a mobile wireless device (e.g., a mobile phone, smartphone, tablet, mobile computing device, wearable device, etc.), the system 700 further includes an image capture device 720, such as a camera), and an audio capture device 719, such as a microphone). The system 700 may further include application interfaces as MMS interface 721, SMS interface 722, email interface 723, social network interface (SNI) 724, audio/video (AV) player 725, web browser 726, image capture interface 727, etc.

In one embodiment, the system 700 includes decoding processing interface 730 that may implement power saving features of process 500 (FIG. 5) and processing similar as described regarding process 600 (FIG. 6). In one embodiment, the decoding processing interface 730 along with an operating system 729 may be implemented as executable code residing in a memory of the system 700. In another embodiment, the decoding processing interface 730 may be provided in hardware, firmware, etc.

As is known to those skilled in the art, the aforementioned example architectures described above, according to said architectures, can be implemented in many ways, such as program instructions for execution by a processor, as software modules, microcode, as computer program product on computer readable media, as analog/logic circuits, as application specific integrated circuits, as firmware, as consumer electronic devices, AV devices, wireless/wired transmitters, wireless/wired receivers, networks, multi-media devices, etc. Further, embodiments of said Architecture can take the form of an entirely hardware embodiment, an entirely software embodiment or an embodiment containing both hardware and software elements.

One or more embodiments have been described with reference to flowchart illustrations and/or block diagrams of methods, apparatus (systems) and computer program products according to one or more embodiments. Each block of such illustrations/diagrams, or combinations thereof, can be implemented by computer program instructions. The computer program instructions when provided to a processor produce a machine, such that the instructions, which execute via the processor create means for implementing the functions/operations specified in the flowchart and/or block diagram. Each block in the flowchart/block diagrams may represent a hardware and/or software module or logic, implementing one or more embodiments. In alternative implementations, the functions noted in the blocks may occur out of the order noted in the figures, concurrently, etc.

The terms "computer program medium," "computer usable medium," "computer readable medium", and "computer program product," are used to generally refer to media such as main memory, secondary memory, removable storage drive, a hard disk installed in hard disk drive. These computer program products are means for providing software to the computer system. The computer readable medium allows the computer system to read data, instructions, messages or message packets, and other computer readable information from the computer readable medium. The computer readable medium, for example, may include non-volatile memory, such as a floppy disk, ROM, flash memory, disk drive memory, a CD-ROM, and other permanent storage. It is useful, for example, for transporting information, such as data and computer instructions, between computer systems. Computer program instructions may be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

Computer program instructions representing the block diagram and/or flowcharts herein may be loaded onto a computer, programmable data processing apparatus, or processing devices to cause a series of operations performed thereon to produce a computer implemented process. Computer programs (i.e., computer control logic) are stored in main memory and/or secondary memory. Computer programs may also be received via a communications interface. Such computer programs, when executed, enable the computer system to perform the features of the embodiments as discussed herein. In particular, the computer programs, when executed, enable the processor and/or multi-core processor to perform the features of the computer system. Such computer programs represent controllers of the computer system. A computer program product comprises a tangible storage medium readable by a computer system and storing instructions for execution by the computer system for performing a method of one or more embodiments.

Though the embodiments have been described with reference to certain versions thereof; however, other versions are possible. Therefore, the spirit and scope of the appended claims should not be limited to the description of the preferred versions contained herein.

What is claimed is:

1. A method comprising:
    decoding, by a receiver device, a spread spectrum coded stream of information including a plurality of codeword blocks, wherein the decoding comprises:
        determining a number of invalid codewords in a particular block of codewords;
        based on a first particular number of invalid codewords in the particular block of codewords, demapping the particular block of codewords and discarding parity codewords of the particular block of codewords; and
        based on a second particular number of invalid codewords in the particular block of codewords, computing a subset of syndrome components using one or more coding enumerations with an update procedure for the subset of syndrome components, if all of the subset of syndrome components are zero erroneous bit errors are absent, otherwise the receiver performs further coding enumerations.

2. The method of claim 1, wherein the decoding further comprises:
    based on a third particular number of invalid codewords, using a BCH decoder to correct errors, demapping the particular block of codewords, and discarding parity codewords of the particular block of codewords.

3. The method of claim 2, wherein the demapping comprises demapping the particular block of codewords into a bit stream.

4. The method of claim 1, wherein the update procedure comprises updating a single syndrome successively as needed using a single operation.

5. The method of claim 4, wherein the update procedure further comprises:
    updating a same single syndrome equation with multiple input combinations.

6. The method of claim 1, wherein the single syndrome comprises a vector including 2t components, where t is a coding error correction capability.

7. The method of claim 3, wherein the receiver device comprises a wireless node.

8. The method of claim 7, wherein the wireless node belongs to a wireless sensor network (WSN).

9. The method of claim 1, further comprising receiving the spread spectrum coded stream of information from a transmitter device.

10. A wireless node comprising:
    a receiver including a decoder, the decoder is configured to:
        determine a number of invalid codewords in a particular block of codewords;
        for a first particular number of invalid codewords in the particular block of codewords, demap the particular block of codewords and discard parity codewords of the particular block of codewords; and
        for a second particular number of invalid codewords in the particular block of codewords, compute a subset of syndrome components using one or more coding enumerations with an update procedure for the subset of syndrome components, if all of the subset of syndrome components are zero erroneous bit errors are absent, otherwise the decoder performs further coding enumerations.

11. The wireless node of claim 10, wherein the receiver receives a spread spectrum coded stream of information including the plurality of codeword blocks.

12. The wireless node of claim 11, wherein the decoder is further configured to:
    for a third particular number of invalid codewords, use a BCH decoder to correct errors, demap the particular block of codewords, and discard parity codewords of the particular block of codewords.

13. The wireless node of claim 11, wherein the decoder is further configured to perform the update procedure by updating a single syndrome successively as needed using a single operation.

14. The wireless node of claim 13, wherein the decoder is further configured to perform the update procedure by successively updating a same single syndrome equation with multiple input combinations.

15. The wireless node of claim 10, wherein the single syndrome comprises a vector including 2t components, where t is a coding error correction capability.

16. The wireless node of claim 10, wherein the wireless node belongs to a wireless sensor network (WSN).

17. A non-transitory processor readable medium that includes a program that when executed by a processor performs a method comprising:
    decoding, by a processor device, a spread spectrum coded stream of information including a plurality of codeword blocks, wherein the decoding comprises:
        determining a number of invalid codewords in a particular block of codewords;
        based on a first particular number of invalid codewords in the particular block of codewords, demapping the particular block of codewords and discarding parity codewords of the particular block of codewords; and
        based on a second particular number of invalid codewords in the particular block of codewords, computing a subset of syndrome components using one or more coding enumerations with an update procedure for the subset of syndrome components, if all of the subset of syndrome components are zero erroneous bit errors are absent, otherwise the processor performs further coding enumerations.

18. The non-transitory processor-readable medium of claim 17, wherein the decoding further comprises:
based on a third particular number of invalid codewords, using a BCH decoder to correct errors, demapping the particular block of codewords, and discarding parity codewords of the particular block of codewords.

19. The non-transitory processor-readable medium of claim 18, wherein the update procedure comprises updating a single syndrome successively as needed using a single operation.

20. The non-transitory processor-readable medium of claim 19, wherein the update procedure further comprises:
successively updating a same single syndrome equation with multiple input combinations.

21. The non-transitory processor-readable medium of claim 17, wherein the single syndrome comprises a vector including 2t components, where t is a coding error correction capability.

22. The non-transitory processor-readable medium of claim 17, wherein the processor belongs to a wireless node in a wireless sensor network (WSN).

23. A receiver comprising:
a decoder processor, the decoder processor is configured to:
determine a number of invalid codewords in a particular block of codewords;
for a first particular number of invalid codewords in the particular block of codewords, demap the particular block of codewords and discard parity codewords of the particular block of codewords; and
for a second particular number of invalid codewords in the particular block of codewords, compute a subset of syndrome components using one or more coding enumerations with an update procedure for the subset of syndrome components, if all of the subset of syndrome components are zero erroneous bit errors are absent, otherwise the decoder processor performs further coding enumerations.

24. The receiver of claim 23, wherein the receiver receives a spread spectrum coded stream of information including the plurality of codeword blocks.

25. The receiver of claim 23, wherein the decoder processor is further configured to:
for a third particular number of invalid codewords, use a BCH decoder to correct errors, demap the particular block of codewords, and discard parity codewords of the particular block of codewords.

26. The receiver of claim 23, wherein the decoder processor is further configured to perform the update procedure by updating a single syndrome successively as needed using a single operation.

27. The receiver of claim 26, wherein the decoder processor is further configured to perform the update procedure by successively updating a same single syndrome equation with multiple input combinations.

28. The receiver of claim 23, wherein the single syndrome comprises a vector including 2t components, where t is a coding error correction capability.

29. The receiver of claim 23, wherein the receiver comprises a wireless node and belongs to a wireless sensor network (WSN).

* * * * *